# United States Patent [19]

Elsner

[11] 4,112,513
[45] Sep. 5, 1978

[54] METHOD FOR REFRESHING STORAGE CONTENTS OF MOS MEMORIES

[75] Inventor: Peter Elsner, Munich, Fed. Rep. of Germany

[73] Assignee: Siemens Aktiengesellschaft, Berlin & Munich, Fed. Rep. of Germany

[21] Appl. No.: 401,190

[22] Filed: Sep. 27, 1973

[30] Foreign Application Priority Data

Sep. 29, 1972 [DE] Fed. Rep. of Germany ....... 2247835

[51] Int. Cl.² ........................................... G11C 29/00
[52] U.S. Cl. ..................................... 365/222; 365/182
[58] Field of Search ....................... 340/173 DR, 173; 365/222

[56] References Cited

U.S. PATENT DOCUMENTS

| | | | |
|---|---|---|---|
| 3,737,879 | 6/1973 | Greene | 340/173 DR |
| 3,748,651 | 7/1973 | Mesnik | 340/173 DR |
| 3,760,379 | 9/1973 | Nibby | 340/173 DR |
| 3,786,437 | 1/1974 | Croxon | 340/173 DR |
| 3,790,961 | 2/1974 | Palfi | 340/173 DR |
| 3,800,295 | 3/1974 | Anderson | 340/173 DR |

Primary Examiner—Terrell W. Fears
Attorney, Agent, or Firm—Hill, Gross, Simpson, Van Santen, Steadman, Chiara & Simpson

[57] ABSTRACT

A method for periodically refreshing dynamic MOS memories is provided in which the memory is divided into a number of separate memory sections, each containing a plurality of refresh locations, and the locations in one section are refreshed each time another of the sections is accessed for reading or writing. The refreshment of the refresh locations in each section is accomplished sequentially, and an index is maintained of which refresh locations have been refreshed during a refreshment period. At the conclusion of each such period, the remainder of the refresh locations in each section are refreshed. It is therefore unnecessary to restrict normal access to the memory for reading and writing during set periods which are set aside for the sole purpose of refreshing the memory contents, since refreshment occurs simultaneously with normal accessing. The mean access time is thereby decreased.

12 Claims, 2 Drawing Figures

METHOD FOR REFRESHING STORAGE CONTENTS OF MOS MEMORIES

BACKGROUND

1. Field of the Invention

The present invention relates to dynamic MOS memories, and more particularly, to a method of refreshing the contents of such memories.

2. The Prior Art

Dynamic MOS memories must be refreshed periodically in order to maintain the information in storage. This is because the operative storage elements function as capacitors which are charged in accordance with the information stored in the memory locations. Due to leakage currents, the capacitors gradually lose their charges if they are not periodically refreshed. Refreshment of the stored information is accomplished by a normal read process, and such process must be performed for each individual storage location periodically, at least once during an interval hereinafter called the refreshment period T. During refreshment, normal access to the memory for reading and writing is blocked. Any attempt to read or write during the refreshment period is delayed, so that the mean access time of the memory is extended.

When the refreshment period T is 2 milliseconds and the cycle time of the memory (for reading and writing) is 0.6 microseconds, the mean access time for a memory having 512 refresh locations is extended by approximately 15 percent. This is because approximately 15 percent of the time is devoted to refreshment, during which normal access is blocked. For a memory having four times the capacity, the mean access time is extended by about 60 percent. This constitutes a serious disadvantage because it is desirable to maintain the means access time of a memory at the lowest possible value, in order to maximize the speed of operation.

SUMMARY OF THE PRESENT INVENTION

It is a principal object of the present invention to provide a dynamic MOS memory having a greatly reduced mean access time.

Another object of the present invention is to provide a method for automatically refreshing portions of a dynamic MOS memory while allowing normal access to other portions of such memory.

These and other objects and advantages of the present invention will become manifest upon an examination of the following specification and the accompanying drawings.

In one embodiment of the present invention, there is provided a method for periodically refreshing a dynamic MOS memory, including the steps of dividing said memory into a plurality of separate sections, refreshing the refresh locations of one of such section while normal access is being had to another one of said sections, maintaining an index of what locations have been refreshed in each memory section during a predetermined time interval, and refreshing the remainder of such memory locations periodically at the end of each such time interval.

BRIEF DESCRIPTION OF THE DRAWINGS

Reference will now be made to the accompanying drawings in which.

DESCRIPTION OF THE PREFERRED EMBODIMENT

Figure 1:
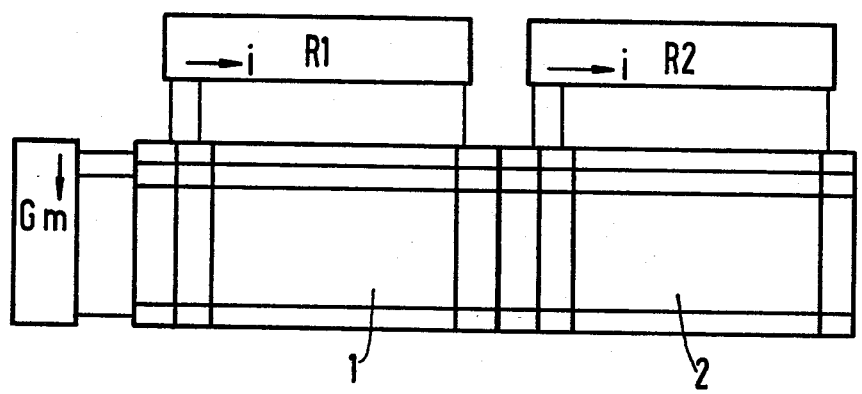
FIG. 1 is a block diagram illustrating one arrangement of apparatus provided for carrying out the method of the present invention.

Referring now to FIG. 1, a MOS memory is indicated as being divided into two sections 1 and 2. Each of the sections has a plurality of groups of storage elements, which are represented in the illustration of FIG. 1 as horizontal rows within the sections 1 and 2. Each group has a plurality of individual refresh locations, which are indicated as separated by vertical columns within the sections 1 and 2. The memory locations within each of the sections 1 and 2 are accessed (during refreshment) by individual counters R1 and R2, while one of the groups common to both sections is accessed (during refreshment) by a counter $G_m$, the outputs of which are connected to the horizontal rows in the sections 1 and 2, as illustrated in FIG. 1. In order to refresh any storage location within the MOS memory, one group is selected by energizing one of the several outputs of the $G_m$ counter, and one address or location in a section is selected by energizing one of the several outputs of the individual counters R1 and R2. The individual refresh location selected for refreshment is that location defined by the row and column which are simultaneously energized.

Although the MOS memory illustrated in FIG. 1 has been divided into two sections 1 and 2, it is contemplated in the present invention that the memory may be divided into K sections, where K may be any number. The K sections are organized in such a way that, simultaneously with a normal access cycle in one of the sections, refreshment takes place in the remaining sections. In a memory with $n$ refresh locations, each section contains $n/K$ refresh locations. The refresh locations in each section are subdivided into $m$ groups of $i$ locations, so that each of the K areas contains $m = n/K.i$ groups with $i$ locations each. The selection of the group containing the individual refresh location to be refreshed is performed by the group counter $G_m$, which supplies the group address, and which is incremented after a time interval $T/m = T.K.i./n$. However, after being incremented, refreshment does not take place immediately. Within the following period $T/m$, normal access can be had to the memory for reading and writing in the normal way. Simultaneously with each normal access to one of the K sections, a refreshment is caused in each of the remaining K-1 sections, in the group of refresh locations which is addressed by the group counter.

A separate refreshment counter is assigned to each of the K sections of the memory, which supplies the $i$ addresses within the group which are addressed by the group counter. If one of these refreshment counters is not reset to zero after expiration of the time $T/m$ which is available per group, that means there are still refresh locations due for refreshment in this group, and the necessary refreshment is carried out location by location until the counters of all K sections of the memory have reached zero. However, if all of the refreshment counters are in their zero states, after $T/m$, no additional refreshment is needed. The group counter is incremented immediately, and there is no interruption in normal access to the memory. The more often the memory is accessed normally, the less frequently will it be necessary to pause for refreshment. In the embodiment shown in FIG. 1, the entire memory is subdivided into $K = 2$ sections, the section 1 containing, for instance, all the even addresses, and the section 2, all the odd addresses. If the memory contains $n = 512$ refresh locations, each of the two sections 1 and 2 comprises $n/K = 256$ refresh locations.

The refresh locations in each section are subdivided into $m$ groups at $i$ addresses each. When $n = 256$, $m$ and $i$ may be 16. The group counter $G_m$ supplies the group address which both areas 1 or 2, respectively, have in common. The two refreshment counters R1 and R2 supply, for each of the two sections 1 and 2, within the respectively addressed group, the individual address. The two counters count independently of each other. Normal access to section 1 is accompanied at the same time by refreshment in section 2, which is controlled by the counter R2. The counter R1 controls refreshment in section 1 simultaneously with normal access to section 2. The refreshment process does not take place in those sections of the memory in which the refreshment counters are already set to zero. On the other hand, after expiration of the period $T/m$ which is available for each group, repetitive refreshment cycles are caused until the two counters R1 and R2 both reach zero. In a memory which is organized and operated in accordance with the present invention, there is practically no extension of the mean access time.

Figure 2:
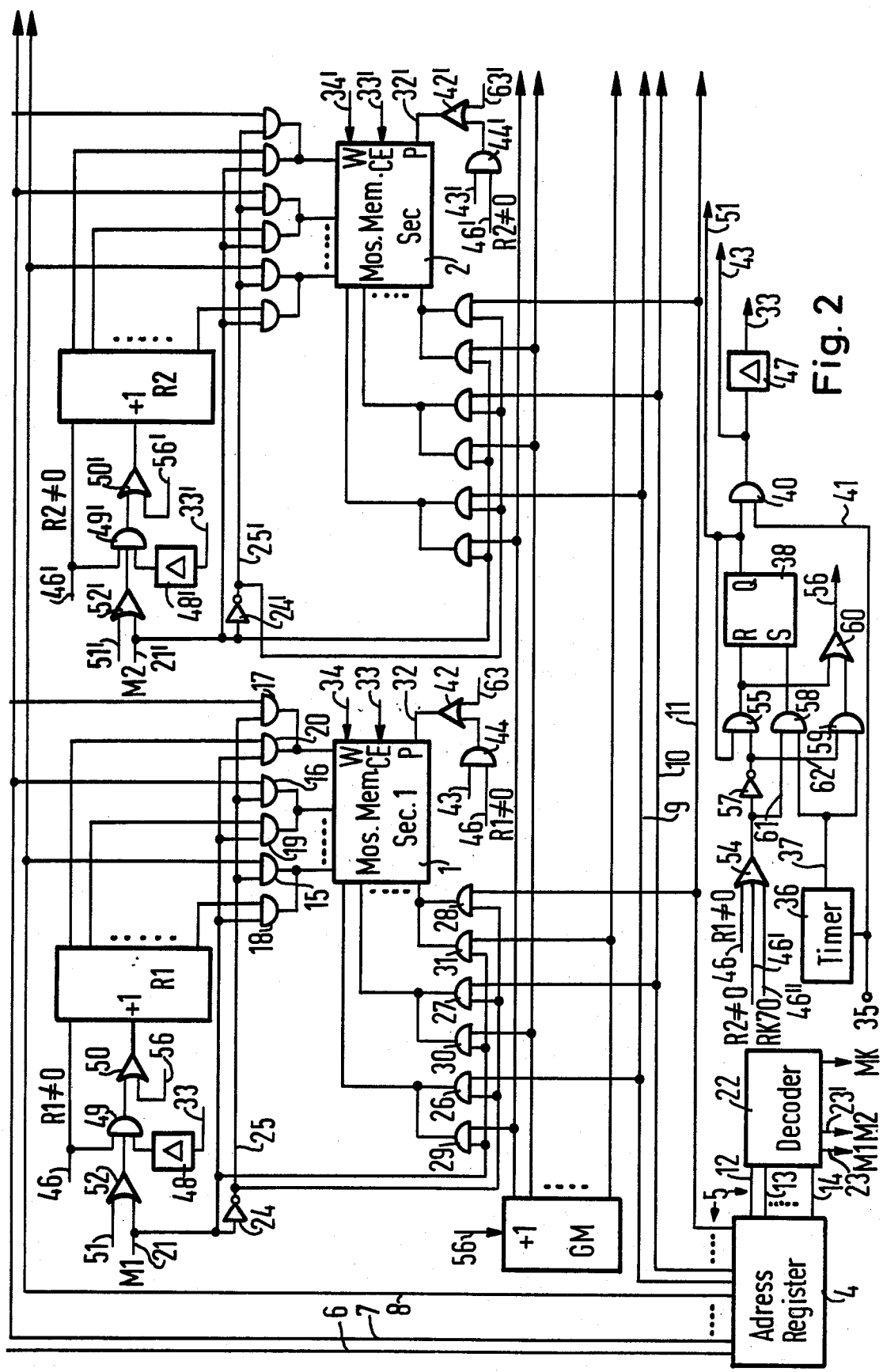
FIG. 2 is a functional block diagram of apparatus for carrying out the method of the present invention.

Referring now to FIG. 2, a functional block diagram of apparatus for carrying out the method illustrated in FIG. 1 is shown. The memory includes sections 1 and 2, which are accessed for normal reading and writing by an address register 4.

The address register 4 is connected with other equipment by which entries are made into the address register 4, designating storage locations which are to be accessed for normal reading and writing. A number of lines 5 are connected to the output terminals of the register 4 for the purpose of selecting a particular storage location. The lines 5 are divided into three series of lines. A first series of lines 6–8 determines the storage location to be accessed within a given group of such locations; a second series 9–11 determines the group to be accessed; and a third series 12–14 determines the memory section to be accessed.

The lines 6–8 are connected to one input each of three AND gates 15–17, the outputs of which are connected with column selecting inputs of the memory section 1 to designate the storage location within this section which is to be accessed for normal reading and writing. Three additional AND gates 18–20 are connected between outputs of the refreshment counter R1 and the column selecting inputs of the memory section 1. The gates 15–17 are enabled when normal access to section 1 is desired, and the gates 18–20 are enabled when storage locations in section 1 are to be refreshed. The second input of each of the gates 18–20 is connected to a line 21, which is connected to one of the outputs of a decoder unit 22. The inputs of the decoder unit 22 are connected to the lines 12–14 of the address register 4. The decoder functions to present high levels on all of its output lines except for one such line, which corresponds to one of the memory sections, and particularly to that section which is addressed by the address register 4 for normal access at any particular time. The output line 23 (labeled $M_1$ in FIG. 2) is normally high except when memory section 1 is addressed, at which time the potential on the line 23 is low.

The line 23 is connected to the line 21 and through an inverter 24 to a line 25. The line 25 is connected to the second inputs of the AND gates 15–17, so that when the potential on the lines 21 and 23 is low, (for normal access to section 1 of the memory), the gates 15–17 are enabled to select the storage location identified in the outputs 6–8 of the address register 4.

The lines 9–11 are connected to inputs of AND gates 26–28, the outputs of which are connected to the row or group selecting inputs of the memory section 1, in order to designate a particular selected group therein. Another series of AND gates 29–31 also have their outputs connected to the group selecting inputs of the memory section 1, but the inputs of the gates 29–31 are connected to the group outputs of the group counter $G_m$.

The second inputs of the gates 26–28 are connected to the line 25, and the second inputs of the gates 29–31 are connected to the line 21, so that the two groups of gates are operated in a mutually exclusive manner. When memory section 1 is addressed by the address register 4 via the decoder unit 22, the line 25 is high, so that the outputs connected to the lines 9–11 of the address register are effective to select the groups of the memory section 1. Otherwise, the group selecting inputs are connected to the group counter $G_m$ via the gates 29–31.

Three additional inputs are connected to the memory section 1 through lines 32, 33, and 34. The line 32 is a so-called pre-charge input line, the line 33 is a so-called chip enable input, and the line 34 is a write input. The level on the line 34 is high when a write operation is desired, and low when a read operation is desired.

When the memory section 1 contains dynamic MOS memories, such as commercially available model No. 1103, marketed by Signetics Corporation of Sunnyvale, Calif., it is necessary to apply a low level signal to the input 32 to condition the memory section 1 for operation, after which a signal applied to the terminal 33 effects a reading operation. If a writing operation is desired, a low level signal is applied to the line 34 at a time following the application of the signal to the terminal 33. For refreshment, a read operation is necessary, which is performed when pulses are successively applied to the lines 32 and 33.

A source of clock pulses is applied to a terminal 35, and the clock pulses are applied to the input of a timer 36, which conveniently may take the form of a binary counter having a radix selected to give overflow pulses on a line 37 at intervals of $T/m$ seconds, where T is the relaxation interval and $m$ is the number of groups into which the refresh locations are divided. The pulses from the timer 36 are applied to the set input of an R-S flip-flop 38 through an AND gate 58, which pulses set the flip-flop to its operated condition, so that the Q output goes high. The second input of the gate 58 is high whenever refreshment is needed. A line 39 is connected from the Q output to one input of an AND gate 40, the second input of which is connected by a line 41 to the terminal 35, so that the clock pulses appear at the output of the gate 40 during the period that the flip-flop 38 is set.

The output of the gate 40 is connected by a line 43 to a gate 44, the output of which is connected to the pre-charge input line 32 of the memory section 1. A second input to the gate 44 is derived from the refreshment counter R1 over a line 46. The potential on the line 46 is high as long as the counter R1 is not in its zero condition, so the clock pulses are applied to the line 32 as long as the R1 refreshment counter is not in its zero condition.

The line 43 is connected through a delay unit 47 to the line 33, so that pulses are applied to the chip enable input line 33 at the appropriate time after each pulse which is applied to the pre-charge line 32. The repetitive pulses applied to the lines 32 and 33 cause the memory section 1 to repetitively execute reading operations to refresh the storage locations which are addressed.

Each such reading operation advances a state of the refreshment counter R1 in the following manner. The line 33 is connected through a delay unit 48 to the input of an AND gate 49, the output of which is connected through an OR gate 50 to the increment input of the R1 counter. A second input to the AND gate 48 is supplied from the Q output of the flip-flop 38 over a line 51 and through an OR gate 52. Thus, the second input of the AND gate 49 is high whenever the flip-flop 38 is set. A third input to the AND gate 49 is connected to the line 46, which is high whenever the R1 counter is not in its zero condition. Thus, the R1 counter is incremented for each refreshment cycle which occurs while the flip-flop 38 is in its set condition, until the R1 counter reaches zero.

When the R1 counter has been advanced to zero, the level on the line 46 goes low, so that no additional signals are applied to the increment input of the R1 counter.

Simultaneously with the refreshment of section 1, all of the other sections of the memory are being refreshed in an identical way, and eventually all of the refreshment counters R1 and R2, etc. assume their zero states.

An OR gate 54 is provided with a plurality of inputs connected to outputs of all of the refreshment counters by lines 46, 46', etc., and the output of the OR gate 54 goes low when all of the refreshment counters have reached their zero condition. The output of the gate 54 is connected to the gate 58 by a line 61, to permit setting of the flip-flop 38 as described above. The output of the gate 54 is also connected through an inverter 57 to one input of an AND gate 55, the other input of which is connected to the line 51. The output of the AND gate 55 is connected to the reset input of the flip-flop 38 so that, as soon as the refreshment counters R1, R2, etc. have been counted to their zero states, the flip-flop 38 is reset. The output of the gate 55 is also connected by a line 56 to a second input of the OR gate 50, so that the refreshment counter R1 is advanced to its first storage location address when the flip-flop 38 is reset.

The line 56 is also connected to the increment input of the $G_m$ counter, to advance the counter to select the next group of storage locations.

If, when the pulse is produced by the timer 37, all of the refreshment counters R1, R2, etc. are already in their zero state, the flip-flop 38 is not set, but the $G_m$ counter and the refreshment counter are incremented. The output of the OR gate 54 is then high, and one input of an AND gate 59 is thus enabled over a line 62. The other input is connected to the line 37, so that the overflow pulse passes through the gate 59 and through the OR gate 60 to the line 56. The output of the inverter 57 is low, so the gate 58 is blocked and the flip-flop 38 is not set. It is therefore not necessary in this case to devote time to refreshing the various sections of the memory, for all have already been refreshed during the previous interval $T/m$.

The control circuit for a second memory section 2 is also illustrated in FIG. 2, but is not described in detail, as it is identical with the apparatus which has already been described in connection with memory section 1. The line $M_2$ is connected from the decoder unit 22 to the line 21' of section 2 and through an inverter 24' to the line 25'. Whenever the line $M_2$ is low, normal access is provided to section 2, and it is refreshed whenever another section is being accessed. Each of the refreshment counters R1, R2, etc. are incremented following each refreshment cycle of its section by a pulse from the CE input line 33, delayed by delay unit 48, and passed through gates 49 and 50, until the counter reaches zero, after which the gate 49 is blocked. The section being accessed normally does not have its refreshment counter incremented because its decoder output $M_1$, $M_2$, etc. is low, blocking the gate 50.

The CE input lines 33 and the write input lines 34 of all of the sections are connected in common, so that all of the sections operate in synchronism. The lines 63, which connect the source of pre-charge pulses through gates 42, 42', to the input line 32, 32', etc., are also connected in common for the same reason.

The apparatus of the present invention can be expanded indefinitely to include any additional number of memory sections, all of which are being refreshed during access to any other memory section. It is therefore evident that, as long as there is frequent enough access to different sections of the memory, all of the sections of the memory are automatically refreshed within the refreshment period, and it is not necessary to devote separate periods for refreshment of the memory during which normal access is blocked.

What is claimed is:

1. A method for refreshing the contents of a dynamic MOS memory, having a plurality of independently addressable sections, including the steps of simultaneously refreshing all but one section of said memory concurrently with each normal access for reading or writing to said one section, said refreshment occurring during each normal access to said one section, said one section comprising any one of said plurality of sections.

2. A method for refreshing the contents of a dynamic MOS memory having first and second independently addressable sections, including the steps of refreshing said first section of said memory concurrently with each normal access for reading or writing to said second section of said memory, and refreshing said second section of said memory concurrently with each normal access to said first section.

3. A method for refreshing the contents of memory cells of a dynamic MOS memory having a plurality of independently addressable sections addressed by a common address register, including the steps of sequentially refreshing non-refreshed cells in a first section of said memory concurrently with each normal access for reading or writing to memory cells in a second section of said memory, defining a refreshment period for said first section during which either of said first and second sections may be accessed normally, manifesting the number of memory cells in said first section which have been sequentially refreshed during said refreshment period, and refreshing, at the end of said period, all of the memory cells within said first section not refreshed during said period.

4. A dynamic MOS memory comprising a plurality of independently addressable memory sections, each containing a plurality of refresh locations, transcribing means for normally accessing one of said refresh locations in one of said sections for executing a reading or writing operation, refreshment means for simultaneously refreshing storage elements in all of the other ones of said sections concurrently with operation of said transcribing means, said refreshment means including addressing means comprising means for addressing the refresh locations of a selected one of a plurality of groups of locations, each of said groups including a plurality of locations in each of said memory sections and means for separately addressing the refresh locations of said groups at locations within said memory sections, said refreshment means also including means for simultaneously refreshing storage locations in each of said sections not being accessed by said transcribing means.

5. The method according to claim 1, including the step of dividing said memory into a plurality of groups, each of said groups including a plurality of refresh locations from each of said sections, simultaneously refreshing the refresh locations of one said group in all of said sections except said one section, and periodically simultaneously refreshing all of the refresh locations in said group which are unrefreshed during a predetermined period.

6. The method according to claim 5, including the steps of counting the refresh locations which are refreshed in each section during each said period.

7. The method according to claim 6, including the step of sequentially selecting said groups for refreshment, each said group being selected when all the refresh locations of the previous group have been refreshed.

8. Apparatus according to claim 4, wherein said addressing means comprises a group counter for selecting one of said groups, and means for incrementing said group counter after the expiration of each time interval equal to $T.K.i/n$, where T is the refreshment period of the memory, K is the number of memory sections, $i$ is the number of refresh locations within a single group of a single section, and $n$ is the number of refresh locations in the memory.

9. Apparatus according to claim 8, including means for delaying refreshment of said refresh locations following incrementing of said group counter, until the expiration of the next said time interval.

10. Apparatus according to claim 9, wherein said address means includes a separate refreshment counter for each memory section, for designating the next refresh location to be refreshed in its respective section.

11. Apparatus according to claim 10, including means for inhibiting refreshment in any memory section when the refreshment counter for such section is in a predetermined state, said state indicating that all refresh locations within the selected group of its section have been refreshed during the previous time interval.

12. Apparatus according to claim 10, including means for successively refreshing all of the refresh locations within a selected group in all of said sections, and means for incrementing said group counter when all of said refreshment counters have reached said predetermined state.

* * * * *